United States Patent [19]

Crosby

[11] 3,949,317

[45] Apr. 6, 1976

[54] FAST RECOVERY LIMITING AND PHASE INVERTING AMPLIFIER

[75] Inventor: Philip Stephen Crosby, Portland, Oreg.

[73] Assignee: Tektronix, Inc., Beaverton, Oreg.

[22] Filed: Sept. 16, 1974

[21] Appl. No.: 506,382

[52] U.S. Cl. .................. 330/30 D; 307/237; 330/28
[51] Int. Cl.² ........................................... H03F 3/45
[58] Field of Search ....... 330/28, 30 D, 69; 307/237

[56] References Cited
UNITED STATES PATENTS

| | | | |
|---|---|---|---|
| 3,370,245 | 2/1968 | Royce et al. ...................... | 330/30 D |
| 3,440,554 | 4/1969 | McGraw et al. ................... | 330/30 D |
| 3,582,802 | 6/1971 | Weekes et al. .................... | 330/30 D |
| 3,622,902 | 11/1971 | Thomas ............................ | 330/30 D |
| 3,676,789 | 7/1972 | Bray ................................ | 330/30 D X |
| 3,735,150 | 5/1973 | Harris .............................. | 330/30 D X |

OTHER PUBLICATIONS

Werner, "Transistor Clipper," RCA Technical Notes, RCA TN No. 732, Jan. 1968.

*Primary Examiner*—James B. Mullins
*Attorney, Agent, or Firm*—Adrian J. LaRue

[57] ABSTRACT

An amplifier comprising a paraphase amplifier and a differential amplifier for converting a signal voltage to a signal current that is linearly related to an input voltage between two well-defined output current limits and further having a dynamic range that is an appreciable fraction of the supply voltage and having low input and output impedance.

4 Claims, 1 Drawing Figure

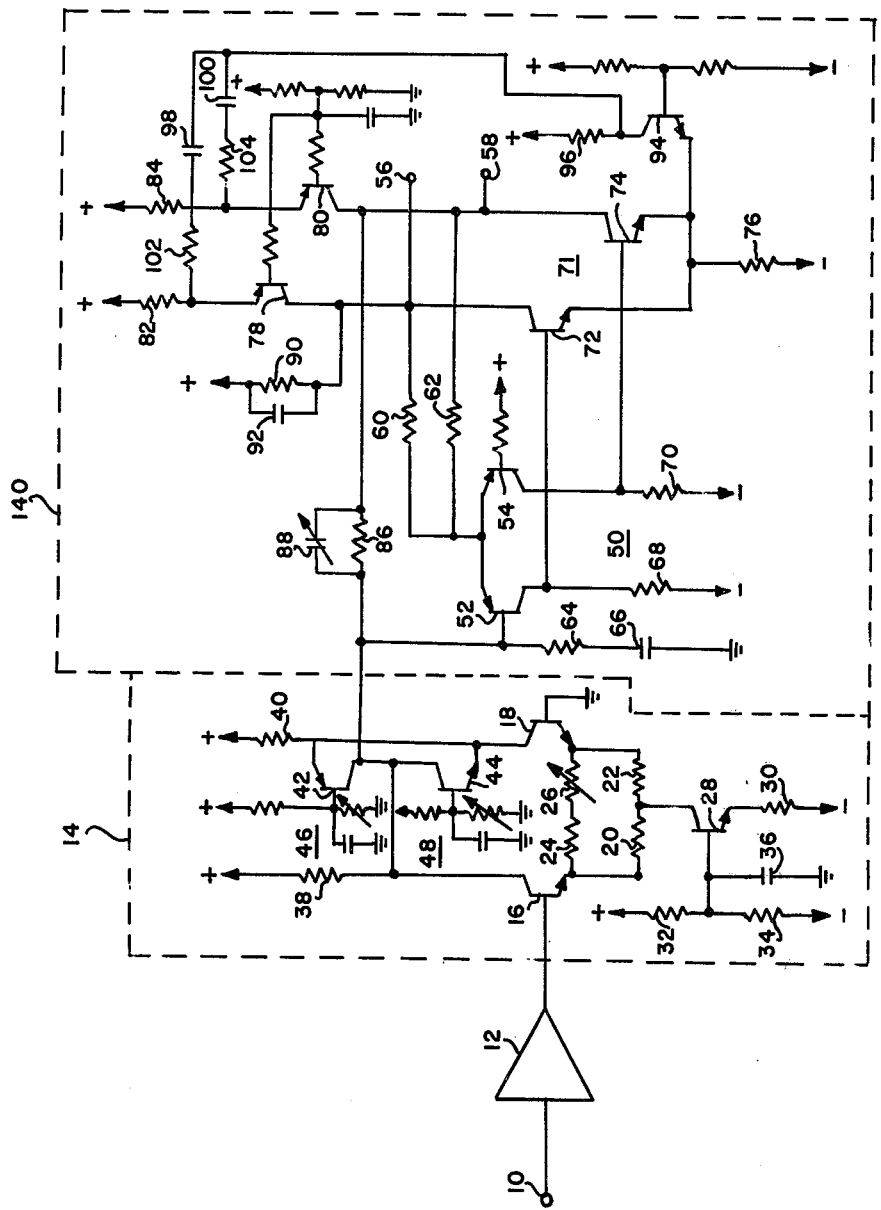

FAST RECOVERY LIMITING AND PHASE INVERTING AMPLIFIER

BACKGROUND OF THE INVENTION

There have been proposed various amplifiers for amplifying a sweep signal to drive deflection plates of a cathode-ray-tube for an oscilloscope or similar oscillographic apparatus. However, such amplifiers have not been completely satisfactory especially in linearity because of, among many other factors, fluctuation of the power supply. For example, an oscilloscope for measuring and monitoring television signals requires an extremely linear amplifier system which is almost completely independent of the power supply, yet is required to have a wide dynamic range.

SUMMARY OF THE INVENTION

The present invention is thus directed to an amplifier for converting a signal voltage to a signal current that is linearly related to an input voltage between two well-defined output current limits and further having a dynamic range that is an appreciable fraction of the supply voltages and has a low input and output impedance. Basically, the amplifier is a paraphast amplifier which comprises a transistorized fast recovery signal limiting amplifier which avoids the use of high-speed limiting diodes and provides the well-defined output current to a differential amplifier which comprises a transistorized phase-inverting shunt feedback amplifier which provides good common-mode control with a minimum of parts and good utilization of supply voltages.

It is therefore an object of the present invention to provide an improved amplifier which is free of the aforementioned disadvantages of the prior art.

It is another object of the present invention to provide an improved amplifier circuit for use as a deflection amplifier.

It is yet another object of the present invention to provide an improved amplifier circuit having a dynamic range that is an appreciable fraction of the supply voltage.

It is still another object of the present invention to provide an improved amplifier circuit having no rapid change of voltage as the limiting threshold is approached.

The foregoing and numerous other objects, advantages, and inherent functions of the present invention will become apparent as the same is more fully understood from the following description, which describes the present invention in its preferred embodiment; it is to be understood, however, that the embodiment is not intended to be exhausting nor limiting of the invention but is given for purposes of illustration in order that others skilled in the art may fully understand the invention and principles thereof and the manner of applying it in particular use so that they may modify it in various forms, each as may best be suited to the conditions of the particular use.

DESCRIPTION OF DRAWING

The single FIGURE is a schematic diagram of the preferred embodiment of the amplifier according to the present invention.

DETAILED DESCRIPTION OF THE INVENTION

The present invention will be described in detail hereinafter by reference to the accompanying single FIGURE which illustrates the preferred embodiment of the present invention, namely a deflection amplifier for an oscillographic apparatus or similar device.

A conventional sweep signal is applied to an input terminal 10 of a conventional amplifier 12 whose gain can be switched into a plurality of steps; such amplifier being similar to one of the amplifiers fully described in "Horizontal Amplifier Circuits," Circuit Concepts Series, TEKTRONIX, INC., copyright 1969. The output of the amplifier 12 is applied to a limiter amplifier 14 which includes a pair of transistors 16 and 18 whose emitters are coupled together through a pair of resistors 20 and 22 and also through a resistor 24 and a variable resistor 26. The common junction of the resistors 20 and 22 is connected to the collector of a current source transistor 28 whose emitter is returned through a resistor 30 to a source of suitable potential and whose base is connected to a bias network consisting of resistors 32-34 and a capacitor 36. The collectors of the transistors 16 and 18 are respectively connected through resistors 38 and 40 to a nest source of suitable potential. The base of the transistor 16 defines an input terminal to be connected to the output of the amplifier 12, and that of the transistor 18 is connected to ground.

The emitters of a PNP transistor 42 and a NPN transistor 44 are connected to th collector of the transistor 18. The collectors of the transistors 42 and 44 are connected to the collector of the transistor 16. Proper bias voltages from variable voltage dividers 46 and 48 are respectively applied to the bases of the transistors 42 and 44.

The limiter amplifier 14 operates as a conventional paraphase amplifier (although only one output is utilized) only when both transistors 42 and 44 are nonconductive. Therefore, the level of an output sweep signal at the collector of the transistor 18 remains substantially within the range between the base voltages of the transistors 42 and 44. Either transistor 42 or 44 couples the collectors of the transistors 16-18 when the collector voltage of the transistor 18 tends to exceed the range and disables the amplifier 14. The gain of the amplifier 14 is primarily determined by the emitter resistors 24-26 and the collector resistor 38 within the linear amplifying range thereof. The sweep rate of the output sweep signal from the amplifier 14 is determined by the input sweep signal to the amplifier 12 and by the gains of the amplifiers 12 and 14 while maintaining the amplitude of the sweep signal unchanged. It is therefore understood that the maximum and minimum levels of the sweep signal can be selected arbitrarily by adjusting the dividing ratio of the voltage dividers 46 and 48.

The output sweep signal from the amplifier 14 (the collector voltage of the transistor 16) is connected to the phase-inverting shunt feedback amplifier portion 140 via a next paraphase amplifier 50 which includes a pair of transistors 52 and 54. The emitters of the transistors 52-54 are coupled together and then connected respectively to a pair of output terminals 56-58 through resistors 60-62. The base of the transistor 52 defines an input terminal of the paraphase amplifier 50 and returned to ground through a series combination of a resistor 64 and a capacitor 66. The base of the transistor 54 is connected to a suitable voltage source. The collectors of the transistors 52-54 are returned through load resistors 68-70 to a negative voltage source and also to a pair of input terminals of a differential amplifier 71 including transistors 72-74 whose emitters are connected in common to a negative voltage source through a common emitter resistor 76.

The collectors of the transistors 72-74 are respectively connected to current source means or the collectors of transistors 78-80 whose bases are connected to a suitable voltage source and whose emitters are connected to a positive voltage source through resistors 82 and 84. The collectors of the transistors 72-74 define respectively the output terminals 56-58 to which a pair of deflection plates of, say, a cathode-ray-;tube may be connected.

A control circuit including a common base transistor 94 is employed to control the current source means. The emitter of the transistor 94 is connected in common to the emitters of the transistors 72-74 to receive a common mode signal developed across the common emitter resistor 76. The base thereof is connected to a suitable bias voltage source. The collector of the transistor 94 is connected through a load resistor 96 to a positive voltage source and also to the emitters of the current source transistors 78-80 through series combinations of coupling capacitor and resistor 98-102 and 100-104, respectively.

A differential sweep signal develops across the collector resistors 68-70 in proportion to the sweep signal from the amplifier 14. Th differential sweep signal controls the collector currents of the transistors 72-74 or the differential amplifier 71. The difference between the collector current from the current source transistors 78-80 and the collector currents of the differential amplifier 71 is effective to charge or discharge the load capacitance connected between the ouput terminals 56-58. The collector of the transistor 74 is connected to the base of the transistor 52 or the input terminal of the paraphase amplifier 50 through a parallel combination of a resistor 86 and a capacitor 88 for providing negative feedback. Similarly, a parallel combination of a resistor 90 and a capacitor 92 having substantially the same electrical values as the resistor 86 and the capacitor 88 is connected between the collectors of the transistor 72 and a positive potential source for providing equal loads to the differential amplifier 71.

Since the emitters of the transistors 52-54 of the paraphase amplifier 50 are connected to the output terminals 56-58 through a pair of equal resistors 60-62, the emitter potential thereof is the average voltage of the output sweep voltages on the output terminals 56-58. This means that the DC level of the differential signal from the paraphase amplifier 50 is primary function of the average voltage of the output sweep signal. Because of the negative feedback loop between the amplifiers 50-71 through resistors 60-62, any variation of the DC level of the sweep output voltage is cancelled and the DC level of the sweep voltage is precisely maintained a predetermined value despite the fluctuation of the voltage sources especially connected to the emitters of the transistors 78-80.

The feedback resistor 86 and capacitor 88 is especially useful to increase the linearity of the output sweep signal under wide sweep range because the voltage swing at the input terminal of the paraphase amplifier 50 is a function of the input signal from the amplifier 14 and the feedback signal through the feedback resistor 86. The capacitors 88-66 and the resistor 64 compensate for the frequency characteristic of the output amplifier stage. If the sweep voltage on the ouput terminal 58 does not follow the input signal applied to the input terminal 10 mainly due to charging-discharging current into the load capacitance at fast sweep rate, the voltage swing at the base of the transistor 52 increases accordingly to enhance the charging-discharging speed until the output sweep signal follows the input sweep signal.

The control circuit including the transistor 94 does not respond to slow variations in the common mode signal because of the relatively short time constant of the coupling capacitors 98-100. However, if very fast sweep rate is selected, the output sweep voltage may not follow the input sweep signal and tends to cause a sharp pulse voltage across the resistor 96. Such spike is effectively transmitted through the coupling capacitors 98-100 to the emitters of the current source transistors 78-80. The transistor 94 decreases the magnitude of the current source means when the differential amplifier 17 flows less output current and vice-versa.

It is known that the deflection sensitivity of a cathode-ray-tube is primarily determined by a gun voltage or the voltage difference between the cathode of an electron gun and the average level of the deflection plate. Therefore, the amplifier according to the present invention can drive deflection plates at a constant deflection sensitivity regardless of the sweep rate and can provide an extremely accurate information display apparatus.

While there has been shown and described the preferred embodiment of the present invention, it will be apparent to those skilled in the art that many changes and modifications may be made without departing from the invention in its broader aspects. For example, amplifier 14 and amplifier 140 can each be utilized, one without the other for various applications, such as pole cancellation and common-mode control respectively. Therefore, the appended claims are intended to cover all such changes and modifications that fall within the true spirit and scope of the invention.

The invention is claimed in accordance with the following:

1. A fast recovery signal limiting amplifier, comprising:
   a paraphase amplifier;
   a current source for providing current to said paraphase amplifier; and
   means for limiting the output of said paraphase amplifier, said means for limiting defining a pair of opposite conductivity transistors connected in common base configuration.

2. A phase-inverting shunt feedback amplifier, comprising:
   a paraphase amplifier for receiving an input signal and providing first and second signals;
   a differential amplifier responsive to said first and second signals for providing different signals;
   current source means for providing current to said differential amplifier;
   means for detecting common mode signals and being operatively connected between said differential amplifier and said current source means to control said current source means; and
   feedback means for controlling the range of the feedback amplifier and being operatively connected between said paraphase amplifier and said differential amplifier.

3. The amplifier according to claim 2 wherein said means for detecting common mode signals define a control circuit including a transistor for controlling the magnitude of current in said current source means.

4. An amplifier, comprising:
means for converting an input signal voltage to a signal current that is linearly related to said signal voltage between two defined current limits, said means for converting including a pair of opposite conductivity transistors connected in common base configuration; and
means for converting said signal current to a plurality of utilization voltages, said means for converting including common mode signal detecting means and feedback means for controlling the range of said utilization voltages.

* * * * *

UNITED STATES PATENT OFFICE
CERTIFICATE OF CORRECTION

PATENT NO. : 3,949,317
DATED : April 6, 1976
INVENTOR(S) : PHILIP STEPHEN CROSBY It is certified that error appears in the above-identified patent and that said Letters Patent are hereby corrected as shown below:

Column 1, Line 25, "paraphast" should be --paraphase--

Column 2, Line 26, "th" should be --the--

Column 3, Line 26, "th" should be --the--

Column 3, Line 28, "or" should be --of--

Column 3, Line 40, "collectors" should be --collector--

Column 3, Line 55 "a predetermined" should be --at a predetermined--

Column 4, Line 17, "17" should be --71--

Signed and Sealed this twenty-ninth Day of June 1976

[SEAL]

Attest:

RUTH C. MASON
Attesting Officer

C. MARSHALL DANN
Commissioner of Patents and Trademarks